United States Patent [19]

Nesbit

[11] Patent Number: 4,856,087
[45] Date of Patent: Aug. 8, 1989

[54] RADIO EQUIPPED INFLATABLE DEVICE

[76] Inventor: Mark S. Nesbit, 1248-17th St., West Des Moines, Iowa 50265

[21] Appl. No.: 240,055

[22] Filed: Aug. 26, 1988

[51] Int. Cl.⁴ ............................................... H04B 1/06
[52] U.S. Cl. ..................................... 455/344; 455/351
[58] Field of Search ............... 455/344, 345, 346, 351, 455/350; 381/159

[56] References Cited

U.S. PATENT DOCUMENTS

| | | |
|---|---|---|
| 2,512,641 | 6/1950 | Halstead . |
| 2,958,769 | 11/1960 | Bounds . |
| 3,946,316 | 3/1976 | Hough . |
| 3,987,258 | 10/1976 | Tsutsui et al. ........................ 455/350 |
| 4,489,770 | 12/1984 | Reich, II ............................. 381/159 |
| 4,503,563 | 3/1985 | Johnson ............................... 455/344 |
| 4,681,195 | 7/1987 | Trahan et al. . |

Primary Examiner—Robert L. Griffin
Assistant Examiner—Curtis Kuntz
Attorney, Agent, or Firm—Henderson & Sturm

[57] ABSTRACT

An air inflatable member for use with water related activities. A waterproof container is attached to the inflatable member for housing an audio signal source, such as a radio, a cassette tape player or a compact disc player. The waterproof container has a conducting wire opening with a waterproof seal to receive a conducting wire that interconnects the waterproof speakers and an audio signal source that are attached to the inflatable member.

15 Claims, 3 Drawing Sheets

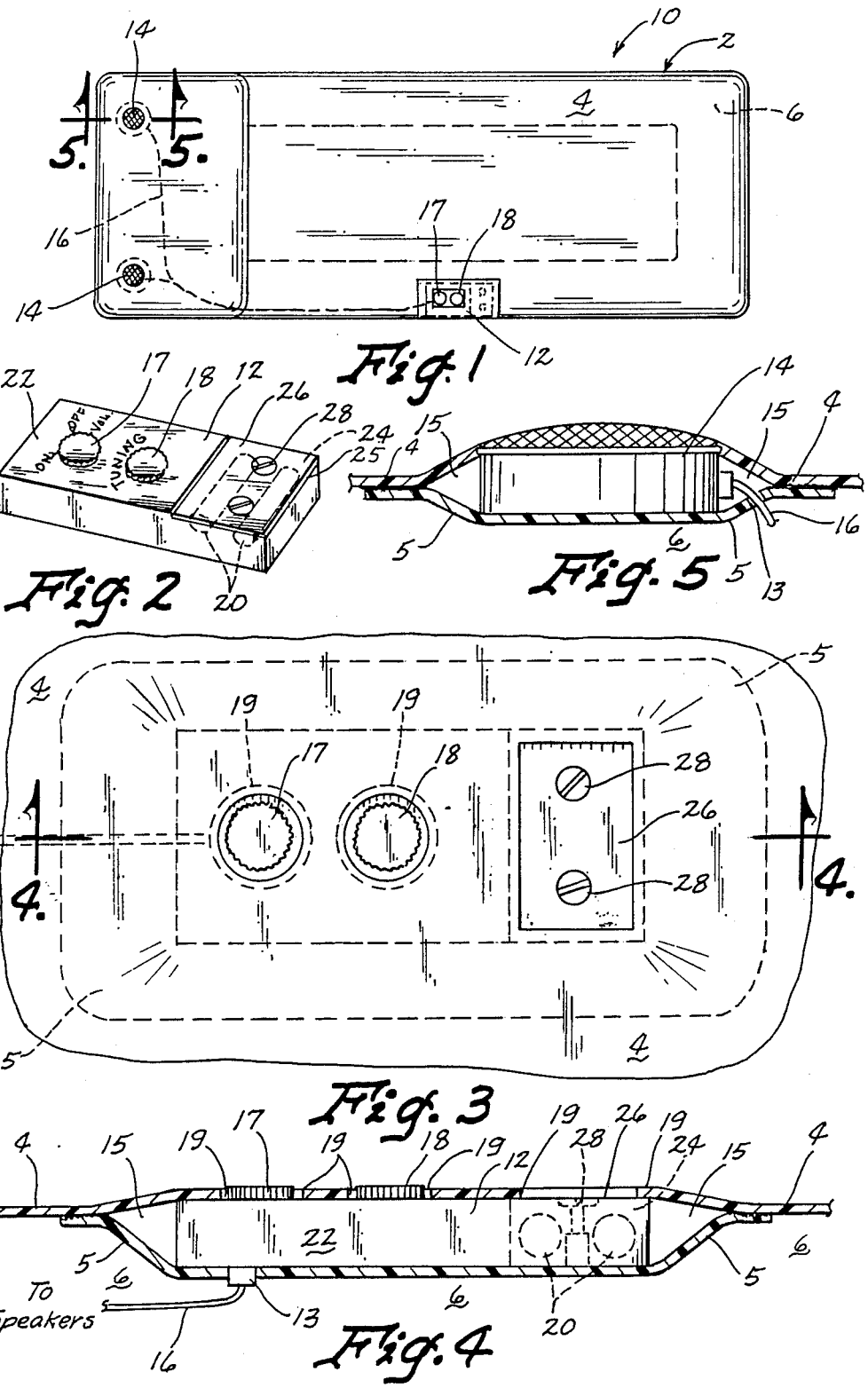

RADIO EQUIPPED INFLATABLE DEVICE

TECHNICAL FIELD

This invention relates to air inflatable water related devices, and more particularly to radio equipped inflatable devices for use with water related activities.

BACKGROUND ART

There are many prior art devices for enjoying water related activities on an air inflated member. There are also many prior art devices for listening to music, news, etc. that can be taken along while enjoying water activities. One problem associated with the prior art devices where the radio, for example, is not waterproof is that accidental contact with the water will damage the radio. Another problem is evident even when waterproof equipment is used. Upon turning upside down, the grasp on the radio might be loosened and the radio would sink to the bottom of the pool or lake and be lost.

Those concerned with these and other problems recognize the need for an improved radio equipped inflatable water related device.

DISCLOSURE OF THE INVENTION

The present invention provides an air inflatable member for use with water related activities. A waterproof container is attached to the inflatable member for housing an audio signal source, such as a radio, a cassette tape player or a compact disc player. The waterproof container has a conducting wire opening with a waterproof seal to receive a conducting wire that interconnects the waterproof speakers and an audio signal source that are attached to the inflatable member.

The audio signal source is encased in an envelope formed in the air space of the inflatable member with the controls being exposed and accessible to the user. The battery access compartment is also waterproof and a seal would be in place and water-tight when the cover is secured onto the access compartment by a screw down access cover. The sheet of material which forms the top side of the inflatable member is sealed to the area surrounding the controls and the access compartment and does not allow water to enter the envelope. It is to be understood that a recharagable power supply could also be housed in the compartment for recharging the unit.

In another embodiment a separate water-tight container with a pouch for containment of a waterproof, foldable headphone audio set is releasably attached by Velcro or glue to the air inflatable member. Use of this device allows private listening with the audio signal source, and convenient removal of the entire unit for use elsewhere.

An object of the present invention is the provision of an improved radio equipped air inflatable device that is prewired with speaker assemblies and speaker wires attached and encased.

Another object of the present invention is to provide a radio equipped air inflatable device that is waterproof and compatible with water related activities.

A further object of the invention is the provision of a radio equipped air inflatable device that allows the user to listen privately to the audio signal source.

Still another object of the present invention is to provide a radio equipped air inflatable device that has a pouch secured thereto for conveniently housing the earphones.

A still further object of the present invention is to provide a radio equipped air inflatable device that is easy to use.

Yet another object of the present invention is the provision of a radio equipped air inflatable device that is inexpensive to manufacture.

BRIEF DESCRIPTION OF THE DRAWINGS

These and other attributes of the invention will become more clear upon a thorough study of the following description of the best mode for carrying out the invention, particularly when reviewed in conjunction with the drawings, wherein:

FIG. 1 is a top plan view of an air mattress showing the placement of a waterproof audio signal source, waterproof speakers and connecting speaker wires;

FIG. 2 is a perspective view of a waterproof radio with batteries housed in the battery compartment being shown in dashed lines;

FIG. 3 is a top plan view of a waterproof audio signal source such as a radio, cassette tape player or compact disc player, the housing of which is shown in dashed lines and being affixed to an air inflatable member such that the controls and the battery compartment are accessible to the user;

FIG. 4 is a side elevation sectional view taken along line 4—4 of FIG. 3 showing an audio signal source being encased in a waterproof envelope, wherein the batteries and screws securing the battery compartment are shown in dashed lines;

FIG. 5 is a side elevation sectional view taken along line 5—5 of FIG. 1 showing a waterproof speaker assembly encased in a waterproof envelope and showing the conducting wire extending into the air space of an air inflatable member;

BEST MODE FOR CARRYING OUT THE INVENTION

Figure 6:
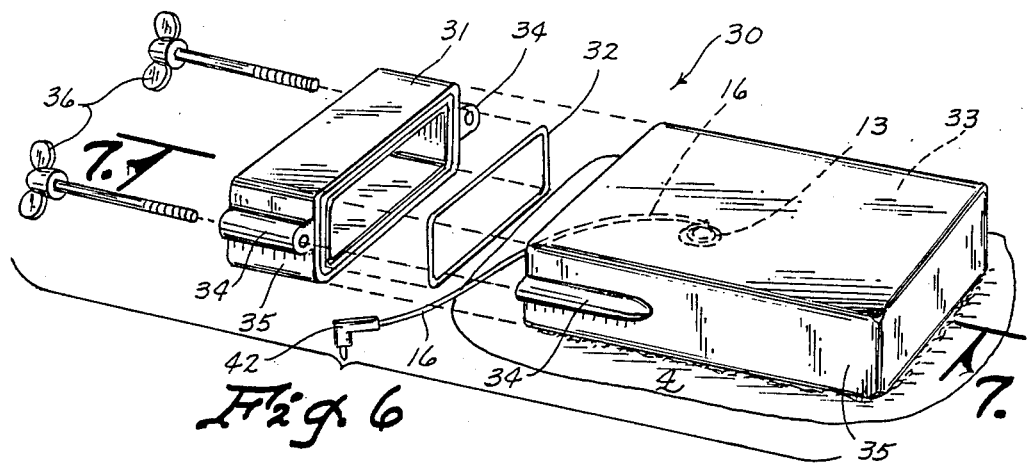
FIG. 6 is an exploded perspective view of a water-tight container secured to the top side of an air inflatable member illustrating the relative orientation of the lid, the bottom containment portion, the water-tight seal, and the winged securing bolts and showing the location of the connecting jack for an audio signal source.

Referring now to the drawings, wherein like reference numerals designate identical or corresponding parts throughout the several views, FIG. 1 depicts the radio equipped inflatable device of the present invention generally at 10. The device (10) includes an air inflatable device such as a raft (2) having a top side and a bottom side formed of sheet material (4) sealed to form an air space (6). An audio signal source (12), a waterproof speaker assembly (14), and an interconnecting conducting wire (16) are attached to the air inflatable member (2). It is to be understood that the audio signal source (12) can include a radio, a cassette tape player or a compact disc player.

The radio (12) as shown in FIGS. 2, 3 and 4 further includes an on/off volume control (17), a tuning selector (18), batteries (20) for the power supply to the radio (12), a waterproof housing (22), a waterproof battery compartment (24), a compartment cover (26), and screws (28) to make a water-tight fit of the compartment cover (26) on the compartment (24). A water-tight gasket (25) is seated between the compartment (24) and the cover (26) to insure a water-tight fit of the two components. A rechargeable female adapter could also be included within the compartment (24) to allow recharging of the radio (12) with a 110–120 volt standard home outlet. Means could also be provided to allow for solar power recharging.

Referring now to FIG. 5 it can be seen that the waterproof speaker (14) is enclosed in an envelope (15) formed in the top side of the inflatable member (2). The envelope (15) is formed by sealing a section of compatible material (5) to the sheet material (4). A waterproof seal (13) is disposed in an opening in the section of material (5) and a conducting wire (16) extends through the seal (13) and electronically connects the speaker assembly (14) to the audio signal source (12). The conducting wire (16) extends into the air space (6) of the inflatable member (2) and may be allowed to move freely or it may be secured to the interior of the top side by any conventional manner.

FIG. 4 depicts a radio (12) housed in a waterproof envelope (15) formed in the same manner as that used for the speaker assembly (14). A waterproof seal (13) receives the conducting wire (16) extending between the radio (12) to the speaker assembly (14). The area (19) surrounding the radio controls (17 and 18) and the compartment cover (26) are sealed to make the envelope (15) waterproof in an inflatable member (2).

Figure 7:
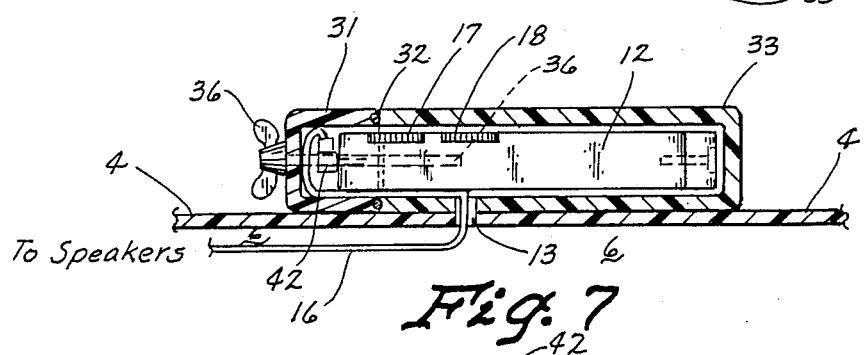
FIG. 7 is a side elevation sectional view taken along line 7—7 of FIG. 6 showing the water-tight container closed and showing the conducting wire extending into the air space of the air inflatable member.

Referring now to FIGS. 6 and 7 an alternate embodiment of the device (10) is shown where a waterproof container (3) is attached to the sheet material (4) on the top side of the inflatable member (2). The waterproof container (30) includes an upper lid portion (31), a water-tight seal (32), and a bottom containment portion (33). Hollow apertures (34) are disposed on each sidewall (35) of the lid portion (31) and bottom portion (33). Winged bolts (36) are inserted into the hollow apertures (34) for securing the lid portion (31) to the bottom portion (33) of the container (30). The winged bolts (36) are made of a plastic or nylon material and are secured to the lid (31) to prevent accidental loss. A conducting wire (16), extends through a water-tight seal (13) in the container (30) to connect an independent audio signal source (12) by the jack (42) to the speaker assembly (14).

Figure 8:
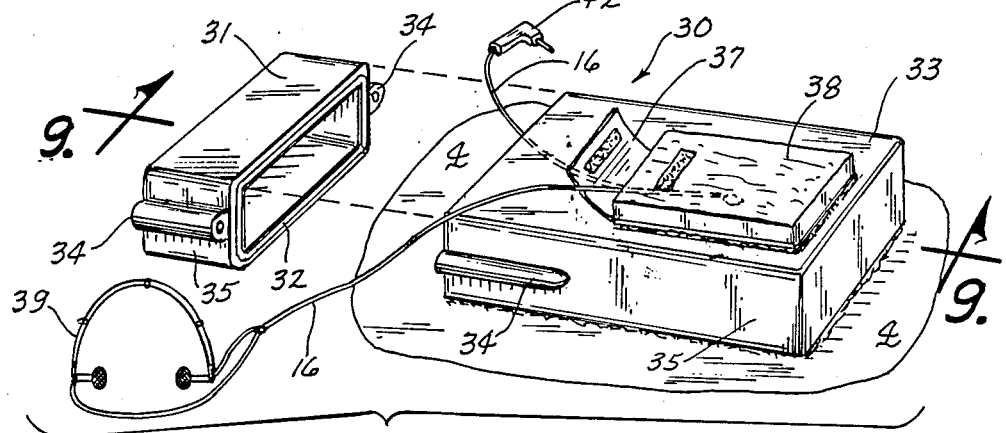
FIG. 8 is an exploded perspective view of a further embodiment of the present invention showing the water tight container secured to an air inflatable member and having a pouch attached on the top side of the container for housing a waterproof earphone assembly used for private listening.
Figure 9:
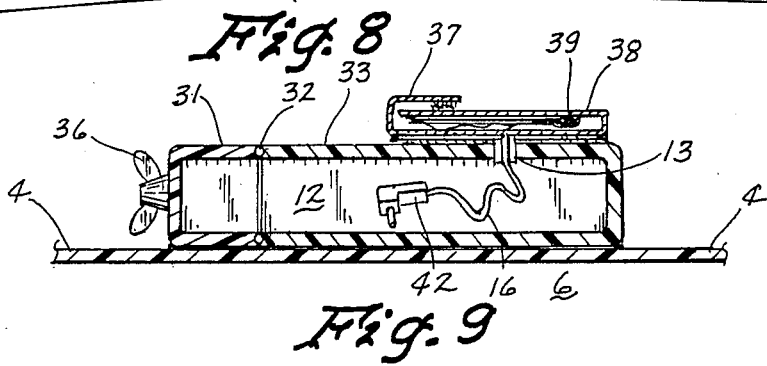
FIG. 9 is a side elevation sectional view taken along line 9—9 of FIG. 8 showing the water-tight container closed and showing the conducting wire between the jack and the earphones extending through a water-tight seal.
Figure 10:
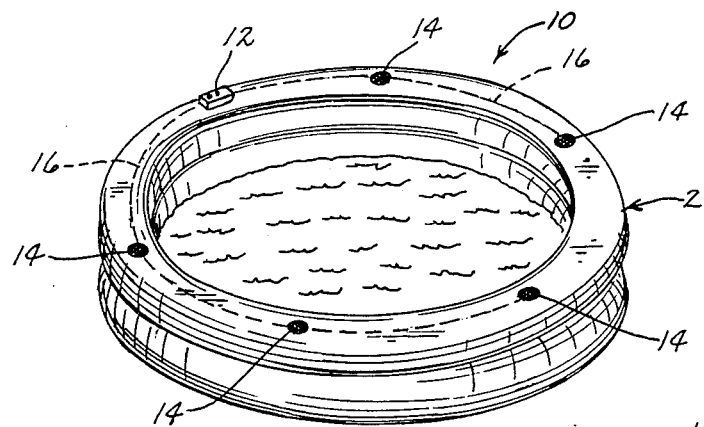
FIG. 10 is a perspective view of an inflatable wading pool showing an audio signal source and speakers disposed around the circumference of the pool.
Figure 11:
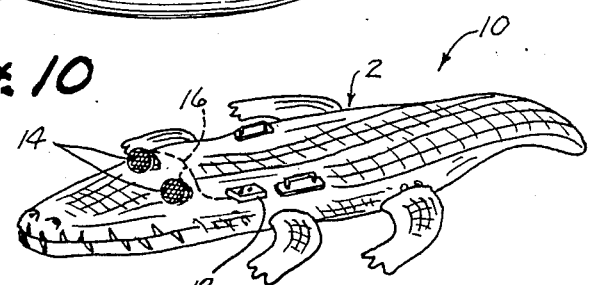
FIG. 11 is a perspective view of an inflatable water toy with an audio signal source disposed thereon and the speakers being placed in the eyes of the toy.
Figure 12:
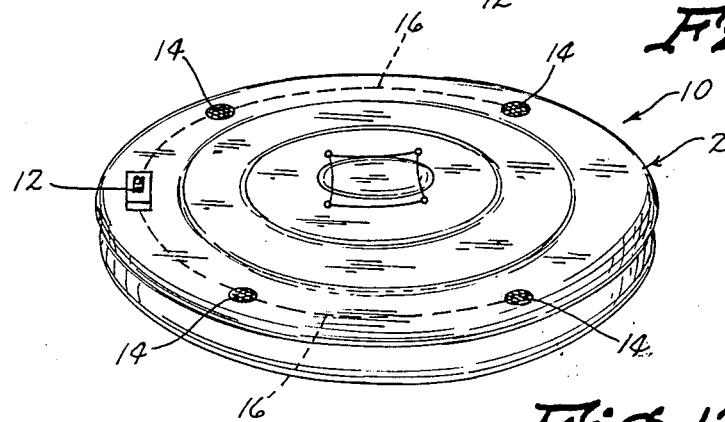
FIG. 12 is a perspective view of an inflatable water island with an audio signal source disposed thereon and speakers being placed around the circumference of the island.

The container (30) as depicted in FIGS. 8 and 9 illustrates yet another embodiment of the device (10). The container in FIGS. 8 and 9 includes the same elements as described in FIGS. 6 and 7, but further includes a pouch (38) attached to the top side of the container (30) by means of an appropriate adhesive. The pouch (38) is attached to the top side of container (30) for storage of a waterproof, foldable earphone (39). The earphone (39) connects to an audio signal source (12) by means of a conducting wire (16) that extends through waterproof seal (13). The conducting wire (16) is of a length sufficient to go from the contact point to the general area of the user's head.

The embodiment depicted in FIGS. 8-9 can be releasably secured to a water raft (2) by Velcro strips (not shown) and then unhooked and moved from one raft (2) to another. Use of any of the embodiments of the device (10) is unlimited and allows use where conditions do not permit normal use of a radio, cassette tape player or a compact disc player.

Figure 13:
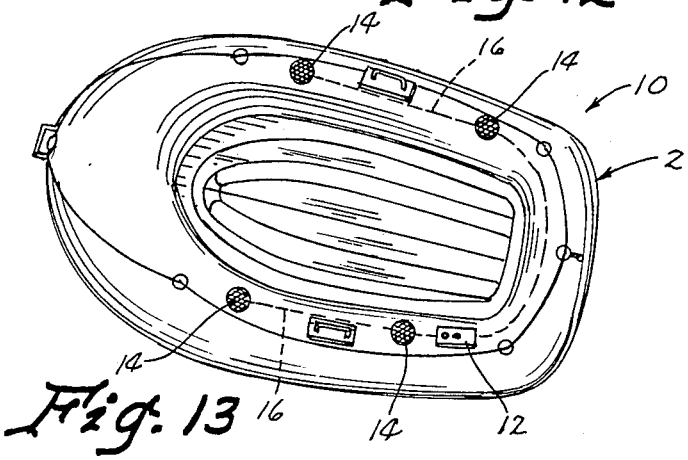
FIG. 13 is a perspective view of an inflatable boat showing placement of an audio signal source and speakers thereon.

FIGS. 10, 11, 12 and 13 represent the device (10) attached to various inflatable members (2) for use with water related activities. An audio signal source (12) is secured to a wading pool (2) and speaker assemblies (14) are disposed around the circumference thereof in FIG. 10. Children can listen to their favorite tapes or songs and sing along while enjoying playtime in the pool (2). The device (10) attached to a floating island (2) in FIG. 12 allows for fun at the beach, swimming pool or anywhere there is water. Speaker assemblies (14) are attached to the eyes of a floating toy (2) in FIG. 11 with the audio signal source (12) being placed at a location convenient for the user. In FIG. 13, the speaker assemblies (14) are conveniently placed around the boat (2) with the audio signal source (12) being placed at a convenient location for the user. The use of the device (10) on the inflatable member (2) as depicted in FIGS. 10–13, overcomes the problem of loss of radios since the radio (12) is securely attached to the inflatable member (2).

To use the device (10) as depicted in FIGS. 1-5, a radio (12), speaker assemblies (14), and conducting wires (16) are sealed in an inflatable member (2) by means well known in the art, such as heat sealing, vulcanizing, electrostatically sealing, gluing, seaming or electronically welding. Removable battery compartment cover (26) is first removed from the compartment (24) by removing the screws (28). Batteries (20) are placed in the proper position in the compartment (24) and the cover (26) is secured to the compartment (24). By use of screws made of plastic or nylon there will be no risk of rust from contact with water and the plastic or nylon screws will not scratch the body of the user. The user then turns on the volume selector (17) and adjusts the channel selector (18) to the desired broadcasting station. Transmission of the station will emit through the waterproof speaker assemblies (14) located in the area of the user's head on the inflatable member (2).

With the embodiment depicted in FIGS. 6 and 7, a radio (12) is first tuned to the appropriate station and the volume adjusted accordingly. The radio (12) is then connected to the conducting wire (16) through the jack (42) which is in place in the inside of the foam lined container (30). The foam interior absorbs shock and prevents damage to an audio signal source (12). The container (30) is secured to an inflatable member by means of gluing, heat sealing or the like. The radio (12) is placed into the bottom portion (33) of the container (30). Water-tight seal (32) is positioned between the lid portion (31) and the bottom portion (33) of the container (30). The lid portion (31) is then fit onto the bottom portion (33) by aligning the hollow apertures (34) of both the lid portion (31) and the bottom portion (33) of the container (30). The winged bolts (36) are then secured down tightly to make a water-tight fit of the lid portion (31) and the bottom portion (33).

Referring to FIGS. 8 and 9 a further embodiment of the device (10) is depicted. To use the device (10) a radio station is preselected and the volume is adjusted by controls (18). The conducting wire (16) is attached to the radio by means of jack (42). The radio (12) is then placed into the bottom portion (33) of container (30). The lid (31) is fit down on the bottom portion (33) with the water-tight seal (32) between the two portions (31 and 32). The winged bolts (36) are then secured down to form a water-tight seal between the lid (31) and bottom portion (33) of container (30). The flap (37) of pouch (38) is lifted and the earphones (39) are removed. Transmission of the preselected radio station is transmitted to the earphones (39) by means of the conducting wire (16). The flap (37) is secured by means of Velcro fasteners or the like.

Thus, it can be seen that at least all of the stated objectives have been achieved. It should be noted that the inflatable members (2) for use with the instant invention may include, but would not be limited to air mattresses, boats and rafts, ride-on animals, aqua discs, floatable islands, loungers, canoes, pools, inner tubes, ski bobs, entertainment centers and all inflatables used with water activities.

Obviously, many modifications and variations of the present invention are possible in light of the above teachings. It is therefore to be understood that, within the scope of the appended claims, the invention may be practised otherwise than as specifically described.

I claim:

1. An enlarged air inflatable member for use with water related activities, said air inflatable member being dimensioned to support both the head and the torso of a user and having a top side and a bottom side sealed together to form an air space, the improvement comprising:
   a waterproof container attached to the top side of said inflatable member, said container including a conducting wire opening and a waterproof seal disposed in said opening;
   an audio signal source disposed within said waterproof container;
   a waterproof speaker assembly attached to the top said of said inflatable member at a point remote from the point of attachment of said waterproof container; wherein, said waterproof speaker assembly includes a plurality of speakers disposed at spaced locations on opposite sides of a head supporting portion of said enlarged inflatable member; and,
   a conducting wire disposed to electronically interconnect said audio signal source and said waterproof speaker assembly, wherein said conducting wire extends through said waterproof seal disposed in said opening.

2. The inflatable member as described in claim 1 wherein a portion of said conducting wire is disposed within said air space.

3. The inflatable member as described in claim 1 wherein said waterproof container includes a bottom containment portion and an upper lid portion, said bottom containment portion further including a bottom side, a top side and sidewalls, said bottom side of said bottom containment portion being secured to said top side of said air inflatable member for containment of said audio signal source.

4. The inflatable member as described in claim 1 wherein said audio signal source is a radio.

5. The inflatable member as described in claim 1 wherein said audio signal source is a cassette tape player.

6. The inflatable member as described in claim 1 wherein said audio signal source is a compact disc player.

7. The inflatable member as described in claim 3 wherein said bottom side of said bottom containment portion is secured to said inflatable member by means of heat sealing.

8. The inflatable member as described in claim 3 wherein said bottom side of said bottom containment portion is secured to said inflatable member by means of gluing.

9. The inflatable member as described in claim 3 wherein said waterproof container further includes a seal disposed between said upper lid portion and said bottom containment portion for making said housing water tight.

10. The inflatable member as described in claim 3 wherein said upper lid portion further includes hollow apertures disposed on each of said sidewalls to receive a securing means.

11. The inflatable member as described in claim 10 wherein said securing means is a winged bolt.

12. The inflatable member as described in claim 3 wherein said bottom containment portion further includes hollow apertures disposed on each of said sidewalls for receiving said securing means.

13. The inflatable member as described in claim 1 wherein said speaker assembly is encased in an waterproof envelope formed in the top side of said inflatable member.

14. The inflatable member as described in claim 3 wherein said speaker assembly is an earphone.

15. The inflatable member as described in claim 14 further including a pouch attached to said top side of said waterproof container, said pouch having a top side, a bottom side, and a flap being selectively openable and closable for removal and storage of said earphone.

* * * * *